United States Patent
Hollmer et al.

(10) Patent No.: US 6,525,966 B1
(45) Date of Patent: Feb. 25, 2003

(54) METHOD AND APPARATUS FOR ADJUSTING ON-CHIP CURRENT REFERENCE FOR EEPROM SENSING

(75) Inventors: Shane C. Hollmer, San Jose, CA (US); Joseph G. Pawletko, New York, NY (US); Binh Quang Le, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/010,985

(22) Filed: Dec. 5, 2001

Related U.S. Application Data

(60) Provisional application No. 60/254,067, filed on Dec. 6, 2000.

(51) Int. Cl.$^7$ .............................................. G11C 16/06
(52) U.S. Cl. ........................ 365/185.2; 365/185.21
(58) Field of Search ........................ 365/185.2, 185.21, 365/185.33, 189.09

(56) References Cited

U.S. PATENT DOCUMENTS

| | | | |
|---|---|---|---|
| 5,629,892 A | * 5/1997 | Tang | 365/185.2 |
| 5,701,265 A | * 12/1997 | Calligaro et al. | 365/185.21 |
| 6,222,770 B1 | * 4/2001 | Roohparvar | 365/185.2 |
| 6,400,607 B1 | * 6/2002 | Pasotti et al. | 365/185.2 |

* cited by examiner

Primary Examiner—Trong Phan
(74) Attorney, Agent, or Firm—Skjerven Morrill LLP

(57) ABSTRACT

Method and apparatus for a memory circuit having a sense amplifier circuit having a sensing amplifier connected to read the data content output of a memory cell where the sense amplifier circuit includes a current source transistor having a gate terminal and having a drain terminal connected to a voltage supply and having a source terminal connected to the sensing amplifier, with a selectable source current in order to account for variation from a desired source current due to variations in the designed source current transistor performance parameters.

27 Claims, 2 Drawing Sheets

METHOD AND APPARATUS FOR ADJUSTING ON-CHIP CURRENT REFERENCE FOR EEPROM SENSING

This application claims priority to Provisional Application No. 60/254,067, filed on Dec. 6, 2000.

BACKGROUND OF THE INVENTION

1. Field of the Invention

The present invention relates to sensing circuits for sensing the state of a memory cell, e.g., in an EEPROM, and more specifically to a method and apparatus for on-chip adjustment of the reference current supplied to the sense amplifier in the sensing circuit.

2. Description of Related Art

As is known in the art, individual cells in an EEPROM are sensed to determine the state of the memory cell using a sensing amplifier. Typically EEPROMs are constructed using a floating gate MOS transistor, with the floating gate charged to a "programmed level" to indicate the presence of a logic "zero" in the memory cell, or "erased" of charge leaving a lower level of charge on the floating gate to indicate the presence of a logic "zero" in the memory cell. The state of the charge on the floating gate modifies the threshold voltagd $V_t$ (gate to source) applied to the control gate of the floating gate MOS transistor, at which the floating gate MOS transistor will turn on. The result is a reading of a logic "zero" if the floating gate is charged, because the higher resulting threshold voltage causes the cell not to turn on and conduct when the control gate (connected to an associated word line in the memory array) is pulled up. On the other hand, the lower charge on the floating gate (and resulting lower threshold voltage) enables the word line to turn on the floating gate MOS transistor of the cell when the word line is pulled up.

Those skilled in the art will appreciate the need to precisely adjust the reference current supplied to the sensing circuit of an EEPROM in order to provide a voltage on the word line to the particular cell that is effective to turn on the cell transistor when the floating gate is at the lower charged state and not to turn on the floating gate transistor when the floating gate is at the more highly charged state. In addition to the charge on the floating gate, (which itself can vary with such factors as manufacturing process variations, supply voltage $V_{cc}$ variation and environmental changes, e.g., temperature), there are other influences upon the threshold voltage of each of the floating gate EEPROM memory cell transistors, including manufacturing process variations.

In the case where the reference current supplied is inadequate to supply the appropriate voltage to turn the floating gate MOS transistor of the memory cell on at the appropriate time and/or not turn it on at the appropriate time, based upon the level of charge stored in the floating gate as representing the programmed or erased state, then the cell is useless. Depending upon the design of the memory, e.g., an EEPROM, the faulty cell can cause the inability to use a section of the memory array or the entire memory array, with the obvious impact on yields of the devices in the manufacturing process.

There exists a need, therefore for the ability to correct on a chip-by-chip basis the impact of variable reference currents resulting from, e.g., fabrication processing variations, in order to prevent the deleterious effects of the reference current variations.

SUMMARY OF THE INVENTION

The present invention, therefore, provides a method and apparatus for adjusting on a chip-by-chip basis the reference current that is supplied to the sensing circuitry. The disclosed method and apparatus provide a memory circuit having a sense amplifier connected to read the data content output of a memory cell, and wherein the sense amplifier includes a current source transistor having a gate and having a drain connected to a voltage supply and having a source connected to the respective bit line, with a selectable source current in order to account for variations from a desired source current due to variations in the designed source current transistor performance parameters. The apparatus and method comprise providing a variable reference voltage with a variable reference voltage generating circuit having an output voltage coupled to the gate of the sense amplifier source transistor, wherein the variable reference voltage generating circuit comprising: a current source transistor having an input connected to the voltage supply and an output connected to the output of the variable reference voltage generating circuit and to a current divider network; the current divider network comprising a plurality of variable current flow arms each having a selection transistor for selecting the respective current flow arm to pass current or not pass current; and, wherein each of the respective current flow arm selection transistors is controlled by a respective bit in a plurality of bits stored in a non-volatile on-chip memory location. The variable reference voltage is buffered to provide a low impedance connection of the voltage to the gates of the respective sense amplifier source current transistors. The variable reference voltage generating circuit source current transistor and the respective sense amplifier current source transistors are selected such that the application of the variable reference voltage produced according to the present method to the gate of the sense amplifier current source transistor will produce essentially the same current through the sense amplifier current source transistor as the total current generated in producing the variable reference voltage.

DETAILED DESCRIPTION OF THE PREFERRED EMBODIMENTS

Figure 1:
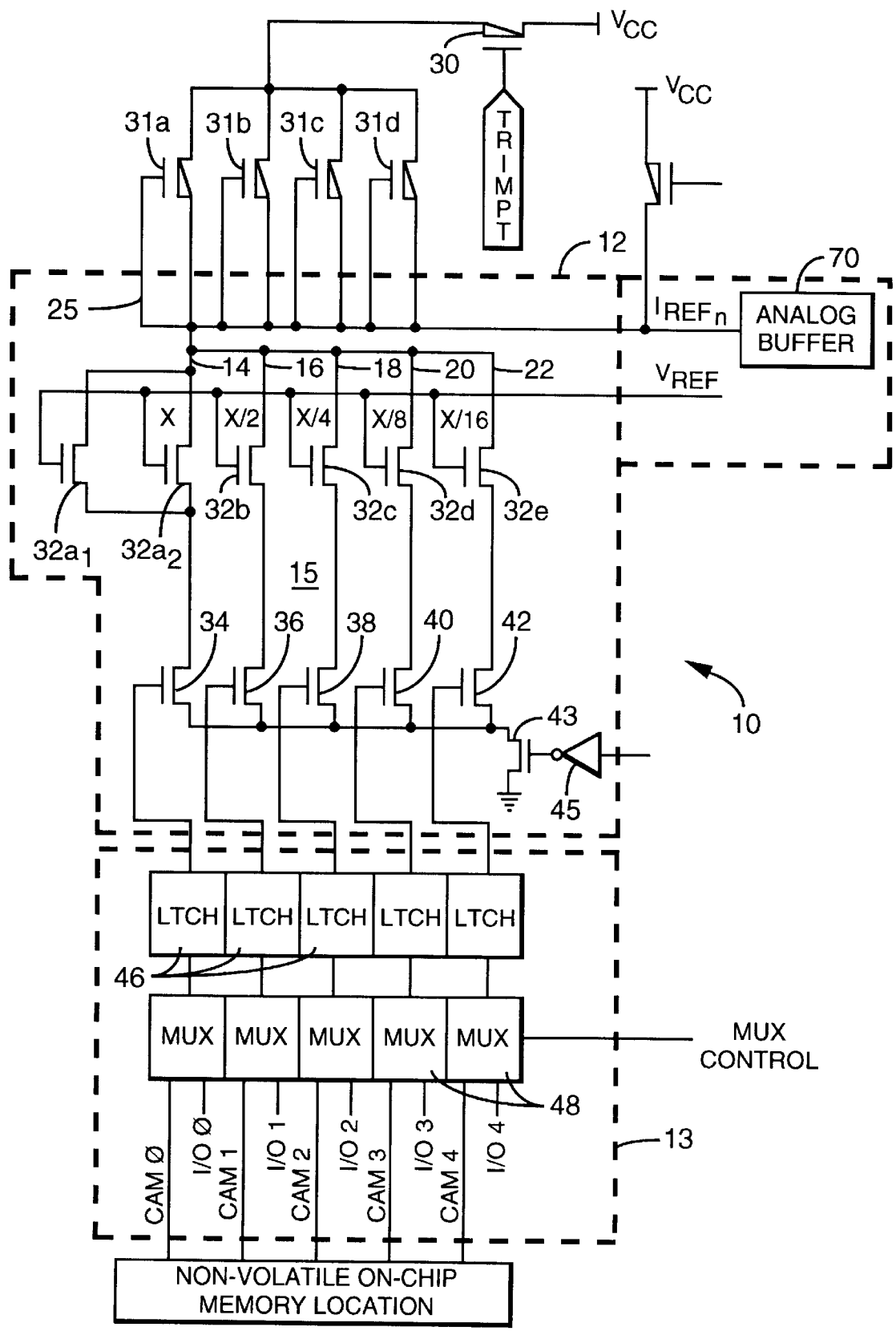
FIG. 1 is a schematic view of the reference current adjusting circuit of a preferred embodiment of the present invention.

Turning now to FIG. 1 there is shown a schematic view of a variable reference voltage setting circuit 10 according to the present invention. The variable reference voltage setting circuit 10 comprises a current divider 12 and a control circuit 13. The current divider 12 is connected to the internal chip supply voltage $V_{CC}$ through a P-channel MOSFET supply transistor 30 which has a channel width (W) to length (L) ratio of 2.0/0.7 (hereinafter all such ratios will be listed in parenthesis after the first reference to a device). The supply transistor 30 has its drain connected to $V_{CC}$ and its source connected to a node 25, which is at the input terminal of an analog buffer circuit 70 and the input terminal of a current dividing network 15, through four diode-connected P-channel MOS transistors 31a (2.1/3.8), 31b (2.1/3.8), 31c (2.1/3.8), and 31d (2.1/3.8) which mirror the current through supply transistor 30 onto the node 25, i.e., at node $I_{REFn}$. $I_{REFn}$ signifies that this circuit is actually duplicated in the embodiment of the present invention, since the memory device of the present invention is split and employs two page buffers for reading from a top half of the memory and a bottom half of the memory (not shown), so that sense amplifier current regulation needs to be trimmed according to the present invention for both the upper and lower page buffers.

The four diode connected MOS transistors 31a–d are connected in parallel to improve the stability and noise rejection of the IREF$_n$ voltage output of the circuit 10. The reference current, e.g., 12 μA, through the supply transistor 30 is divided by four through the parallel diode-connected devices 31a–d due to the identical width/length ratio of each device 31a–d, i.e., each has 3 μA flowing through it. Each of the P-channel devices was sized in order to have W as small as possible but to still achieve good matching for layout efficiency in the page buffer sensing circuitry of the memory sensing circuitry shown in FIG. 3. Lower gate-to-source voltage ($V_{gs}$) leads to smaller sensitivity to supply voltage variations ("$\Delta V_{CC}$ errors" and $V_{gs}$) must be small enough to keep the N-channel sources in saturation for all operating conditions. The gate of supply transistor 30 is connected to the control signal TRIMPT, which enables the operation of the circuit 10.

The current dividing network 12 consists of five current divider branches 14, 16, 18, 20 and 22, each of which has one or more N-channel MOS current division transistors 32$a_1$ (2.0/5.0), 32$a_2$ (2.0/5.0), 32b (2.0/5.0), 32c (2.0/10.0), 32d (2.0/20.0)and 32e (2.0/40.0). The drain of each MOS transistor 32a–e is connected to node 25, i.e., to the source of each of the current mirror transistors 31a–d and the input to the analog buffer 70. The source of each MOS transistor 32a–e is connected to the drain of a respective one of a plurality of N-channel MOS selection transistors 34, 36, 38, 40 and 42. The MOS transistors 32a–e each have a gate connected to a reference voltage $V_{REF}$. The reference voltage $V_{REF}$ is a very stable reference, provided, e.g., by a bandgap reference voltage source (not shown). The reference voltage ensures that the drains to source voltage at each of the transistors 32a–e remains essentially constant so that the drain to source voltage minus the threshold voltage at each transistor 32a–e remains essentially constant. Since the current through each transistor 32a–e is proportional to $(V_{gs}-V_t)^2$ the current through each transistor 32a–e will remain essentially proportional to the current through each of the other transistors 32a–e, dependent only upon the relationship of the width to length ratio of each transistor.

Each of the current division transistors 32a–e is configured to pass a proportionally regulated amount of current in relation to the others by the width to length ratio of the channel of the respective current division transistor 32a–e (i.e., the current through each transistor is proportional to the ratio of the width to the length of each channel). Current divider leg 14 is configured to pass the full desired value (X) of the current to be mirrored in the sense amplifier transistor 132 (shown in FIG. 3) of the sense amplifier circuit 130, as will be explained more fully below. This is accomplished in the present embodiment by utilizing two N-channel MOS transistors 32$a_1$ and 32$a_2$ connected in parallel to give an effective W/L ratio of 2/2.5. Transistor 32b is configured to pass one half of that value (X/2) of the current in transistors 32a, and 32$a_2$ with its W/L ratio of 2.0/5.0, where X is the current passing through current division leg 14 when transistor 34 is conducting. Similarly transistor 32c (2.0/10) is configured to pass one fourth of the desired current (X/4), transistor 32c (2.0/20) is configured to pass one eighth of that current (X/8) and transistor 32d (2.0/40) is configured to pass one sixteenth of that current (X/16).

By selecting all of the possible variations of the on-off status of the selection transistors 32a–e thirty-two possible current levels are selectable. Each of the selection transistors 34–42 has a gate connected to an output terminal of a respective latch 46 in the selection circuit 13. Each of the selection transistors 34–42 has its source connected to ground through an N-channel MOS transistor 43 (15/0.7) which has its gate connected to a control signal "power down" through an inverter 45.

Each of the respective latches 46 is connected to the output terminal of a respective 2:1 multiplexer ("MUX") 48. Each MUX 48 terminal receives a respective Content Addressable Memory input signal CAM0, CAM1, CAM2, CAM3, and CAM4, and a respective input/output input I/01, I/02, I/03 and I/04. Each of the MUXs 48 is responsive to a MUX control signal to select between the respective CAM and I/O input as input to its respective latch 46. It will be understood by those skilled in the art that the CAM provides non-volatile storage of the respective 32 different code combinations to control the current divider circuit 12.

In operation, the output signal of a five-bit CAM memory location is loaded by the MUX control signal into the respective latches 46. The presence of a logic 1 in a respective latch 46 leaves the respective selection transistor 34–42 conducting and correspondingly the presence of a logic 0 in the respective latch 46 leaves the respective selection transistor 34–42 non-conducting. In this manner, the coded content of a CAM address location will vary the current divider circuit 10 to provide one of thirty-two different selectable current levels passing through the supply transistor 30, ranging from 0×X to 1.9375X in increments of 0.0625X, where X is the current passing through current division leg 14 when transistor 34 is conducting.

The value of the current flowing through the supply transistor 30 is proportional to $(V_{gs}-V_t)^2$ so that the voltage at the input terminal to the analog buffer 70 varies with the current through the supply transistor 30, as determined by the coded content of the latches 46.

Figure 2:
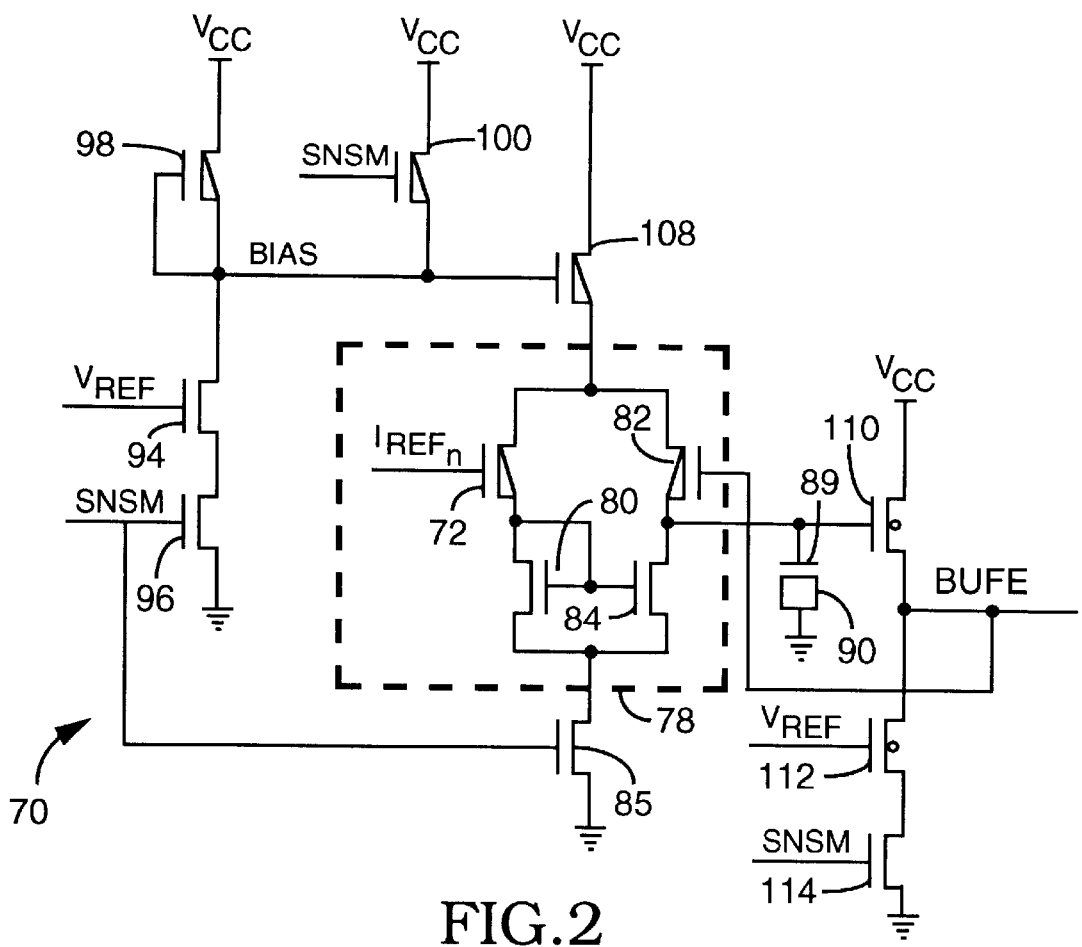
FIG. 2 is a schematic view of the analog buffer circuit of the embodiment of FIG. 1.

Turning now to FIG. 2, there is shown an analog buffer 70 of the present embodiment, which is a unity gain buffer for providing a low impedance output signal of the reference current through transistor 30. Analog buffer circuit 70 receives $I_{REFn}$ at the gate of a P-channel MOS transistor 72 (175/1.2) which is part of a unity gain charge pump 78. Charge pump 78 also includes a diode-connected N-channel transistor 80 which has its drain and gate connected to the source of transistor 72 and to the gate of an N-channel transistor 84 (30/2). Transistor 84 has its drain connected to the source of P-channel transistor 82 (175/1.2) and its source connected to the source of transistor 80 and also to ground through an N-channel transistor 85 (50/0.8) the gate of which is connected to a control signal SNSM. The source of transistor 82 and the drain of transistor 84 are connected to the gate of a depletion mode N-channel transistor 89, the source and drain of which are connected to each other and to ground to form a MOS capacitor 90 (80.6/11.2245). The gate of transistor 82 receives signal BUFE.

The drains of transistor 72 and 82 are supplied with supply voltage $V_{CC}$ through a P-channel transistor 108, the gate of which is connected to receive a bias voltage BIAS. The bias voltage BIAS is generated by a circuit including an N-channel MOS transistor 94 (14/4) which has its gate connected to receive reference voltage $V_{REF}$ and its source connected to ground through an N-channel control transistor 96 (20/0.7) which has its gate connected to the control signal SNSM. The drain of transistor 94 is connected to a diode connected P-channel transistor 98 (6/1.2), the drain of which is connected to receive supply voltage $V_{CC}$. The gate and source of the transistor 98 are also connected to the source of a P-channel MOS transistor 100, the drain of which is connected to receive supply voltage $V_{CC}$ and the gate of which is connected to receive the control signal SNSM.

The non-grounded electrode of the MOS capacitor 90, i.e., the gate 89, is also connected to the gate of a depletion mode N-channel MOS transistor 110 (100/1.5), the drain of which is connected to receive supply voltage $V_{CC}$ and the source of which is connected to receive the output BUFE of the buffer circuit 70. The output signal BUFE is also coupled to the drain of a depletion mode N-channel MOS transistor 112 (11/2) the gate of which is connected to receive reference voltage $V_{REF}$ and the source of which is connected to ground through an N-channel MOS transistor 114 (60/0.7) the gate of which is connected to receive signal SNSM.

Unity gain buffer 70 is effective over the full range of the signal $I_{REFn}$ produced by the current setting circuit 10. Utilizing reference voltage $V_{REF}$ to set the bias voltage BIAS in the buffer circuit 70 reduces temperature and $V_{CC}$ variation errors in the circuitry of the present invention. The output stage of the buffer circuit 70 is designed to provide enough pull-down current to get the large P-channel loads in the sensing circuitry of FIG. 3 into regulation at the beginning of sensing. Typically this time is designed to be about 300 ns, though sensing has to wait for a timing control in the sensing circuitry bit line control (BLCNTRL) (not shown) to go to a logic high.

Figure 3:
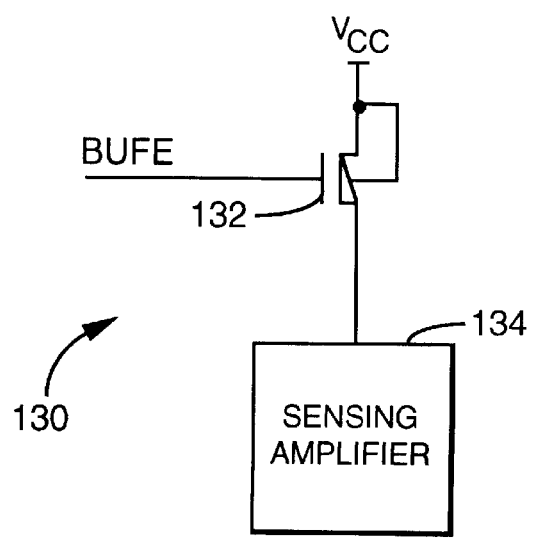
FIG. 3 is a schematic view of a portion of a page buffer circuit of a memory device according to the present invention.

Turning now to FIG. 3, there is shown a schematic view of a portion of a sense amplifier circuit 130 in, e.g., a page buffer in, e.g., an EEPROM memory device. The current supply transistor 132 (2/3.8) in the sense amplifier circuit 130 is identical to the transistors 31a–d in the variable reference voltage setting circuit 10. The application of signal BUFE to the gate of transistor 132 mirrors the same current that is passing through the transistors 31a–d, e.g., 3 µA out of transistor 132 such that the voltage at the node 25 connecting the analog buffer circuit 70 and the input to the current divider network 12 is the same as the voltage at the source of transistor 132, connected to the sensing amplifier 134.

The ability afforded by the present invention to adjust this current by establishing the value of the current passing through supply transistor 30, as explained above, enables the on-chip setting of a sense amplifier current source. This current setting has a sufficient granularity of selection levels so as to set the appropriate sense amplifier source current despite variations in that current from the desired level due to certain variables, e.g., manufacturing process variances.

The I/O inputs to the MUXs 48 enable the selection of a coded input for calibration purposes which is input through I/O pins on the chip to modify the source current to the sense amplifier circuits 130 to determine in the field the appropriate modification that needs to occur to achieve the desired value. After this the on-chip source of the appropriate five bit code is selected from the CAM (not shown) or other nonvolatile storage. The appropriate coded five bits thereafter set the desired source current in the EEPROM sense amplifiers.

What is claimed is:

1. A memory circuit having:
   a sense amplifier circuit having a sensing amplifier connected to read a data content output of a memory cell, wherein the sense amplifier circuit includes a current source transistor having a gate and having a drain, the drain connected to a voltage supply, and having a source connected to the sensing amplifier; and
   an apparatus for providing a selectable sense amplifier source current, the apparatus comprising:
   a variable reference voltage generating circuit having an output coupled to the gate of the sense amplifier circuit current source transistor;
   the variable reference voltage generating circuit comprising:
   a supply transistor having an input connected to the voltage supply and an output connected to the output of the variable reference voltage generating circuit and to a current divider network;
   the current divider network comprising a plurality of variable current flow arms each having a selection transistor for selecting a respective one of the plurality of variable current flow arms to pass current or not pass current; and
   wherein the selection transistor of each one of the plurality of variable current flow arms is controlled by a respective bit in a plurality of bits stored in a non-volatile on-chip memory location.

2. The memory circuit of claim 1, wherein the apparatus further comprises: an analog buffer circuit having an input connected to the output of the variable reference voltage generating circuit and an output connected to a plurality of sense amplifier circuits, the output providing a low impedance output for distribution of the output of the variable reference voltage generating circuit to the gate of the current source transistor of each of the plurality of sense amplifier circuits.

3. The memory circuit of claim 1, further comprising:
   a total current selection circuit having a first signal representative of each of the plurality of bits stored in the non-volatile on-chip memory location;
   a second signal representative of each of a plurality of bits provided through at least one input/output pin of the memory circuit; and
   a selection control signal controlling a selection between the first and second signals as an output of the total current selection circuit.

4. The memory circuit of claim 2, further comprising:
   a total current selection circuit having as inputs a first signal representative of each of the plurality of bits stored in the non-volatile on-chip memory location, and a second signal representative of each of a plurality of bits provided through at least one input/output pin of the memory circuit; and
   a selection control signal controlling a selection between the first and second signals thereby providing an output of the total current selection circuit.

5. The memory circuit of claim 3, wherein the output of the total current selection circuit comprises a plurality of control bits each connected to control the selection transistor of a respective one of the plurality of variable current flow arms.

6. The memory circuit of claim 4, wherein the output of the total current selection circuit comprises a plurality of control bits each connected to control the selection transistor of a respective one of the plurality of variable current flow arms.

7. The memory circuit of claim 3, wherein each of the respective one of the plurality of variable current divider arms includes a current divider FET transistor having a source-to-drain current, wherein the source-to-drain current of each of the current divider FET transistor has a different integer fraction of a selected unit value of current.

8. The memory circuit of claim 4, wherein each of the respective one of the plurality of variable current divider arms includes a current divider FET transistor having a source-to-drain current, wherein the source-to-drain current of each of the current divider FET transistor has a different integer fraction of a selected unit value of current.

9. The memory circuit of claim 3, wherein the output of the total current selection circuit is latched in a latch having a plurality of positions each corresponding to a selected one of the plurality of control bits and each of the plurality of positions having an output connected to a switch in the respective one of the plurality of variable current flow arms.

10. The memory circuit of claim 4, wherein the output of the total current selection circuit is latched in a latch having a plurality of positions each corresponding to a selected one of the plurality of control bits and each of the plurality of positions having an output connected to a switch in the respective one of the plurality of variable current flow arms.

11. The memory circuit of claim 1, wherein the sense amplifier circuit current source transistor and the supply transistor are MOSFET transistors of the same channel type and construction having essentially a same threshold voltage and operating such that a same gate-to-source voltage passes a same amount of current.

12. The memory circuit of claim 2, wherein the sense amplifier circuit current source transistor and the supply transistor are MOSFET transistors of the same channel type and construction having essentially a same threshold voltage and operating such that a same gate-to-source voltage passes a same amount of current.

13. A memory circuit having:
a sense amplifier circuit having a sensing amplifier connected to read a data content output of a memory cell, wherein the sense amplifier circuit includes a current source transistor having a gate and having a drain, the drain connected to a voltage supply, and having a source connected to the sensing amplifier; and
a means for providing a selectable sense amplifier source current in order to account for variation from a desired source current due to variations in a designed source current transistor performance parameters, the means for providing the selectable sense amplifier source current comprising:
a variable reference voltage generating means for generating a voltage on an output coupled to the gate of the sense amplifier circuit current source transistor;
the variable reference voltage generating means comprising:
a supply transistor having an input connected to the voltage supply and an output connected to the output of the variable reference voltage generating means and to a current divider network;
wherein the current divider network comprising a plurality of variable current flow arms each having a selection means for selecting a respective one of the plurality of variable current flow arms to pass current or not pass current; and
wherein the selection means of each one of the plurality of variable current flow arms is controlled by a respective bit in a plurality of bits stored in a non-volatile on-chip memory location.

14. The memory circuit of claim 13, further comprising a buffer circuit means having an input connected to the output of the variable reference voltage generating means and an output connected to the gate of the current source transistor of each of a plurality of sense amplifier circuits, for providing a low impedance output for distribution of the output of the variable reference voltage means to the gate.

15. The memory circuit of claim 13, further comprising:
a total current selection means having as inputs a first signal representative of each of the plurality of bits stored in the non-volatile on-chip memory location, and a second signal representative of each of a plurality of bits provided through at least one input/output pin of the memory circuit; and
a control means for controlling a selection between the first and second signals as an output of the total current selection means.

16. The memory circuit of claim 14, further comprising a total current selection means having as inputs a first signal representative of each of the plurality of bits stored in the non-volatile on-chip memory location and a second signal representative of each of a plurality of bits provided through at least one input/output pin of the memory circuit, and having a control means for controlling a selection between the first and second signals thereby providing an output of the total current selection means.

17. The memory circuit of claim 15, wherein the output of the total current selection means comprises a plurality of control bits each connected to control the selection transistor of a respective one of the plurality of variable current flow arms.

18. The memory circuit of claim 16, wherein the output of the total current selection means comprises a plurality of control bits each connected to control the selection transistor of a respective one of the plurality of variable current flow arms.

19. The memory circuit of claim 15, wherein the total current selection means in each of the respective one of the plurality of variable current divider arms comprises a current divider FET transistor having a source-to-drain current, wherein the source-to-drain current of each of the current divider FET transistor has a different integer fraction of a selected unit value of current.

20. The memory circuit of claim 16, wherein the total current selection means in each of the respective one of the plurality of variable current divider arms comprises a current divider FET transistor having a source-to-drain current, wherein the source-to-drain current of each of the current divider FET transisor has a different integer fraction of a selected unit value of current.

21. The memory circuit of claim 15, wherein the output of the total current selection means is latched in a latch having a plurality of positions each corresponding to a selected one of the plurality of control bits and each of the pluality of positions having an output connected to a switch in the respective one of the plurality of variable current flow arms.

22. The memory circuit of claim 16, wherein the output of the total current selection means is latched in a latch having a plurality of positions each corresponding to a selected one of the plurality of control bits and each of the pluality of positions having an output connected to a switch in the respective one of the plurality of variable current flow arms.

23. The memory circuit of claim 13, wherein the sense amplifier circuit current source transistor and the supply transistor are MOSFET transistors of the same channel type and construction having essentially a same threshold voltage and operating such that a same gate-to-source voltage passes a same amount of current.

24. The memory circuit of claim 14, wherein the sense amplifier circuit current source transistor and the supply transistor are MOSFET transistors of the same channel type and construction having essentially a same threshold voltage and operating such that a same gate-to-source voltage passes a same amount of current.

25. A method for a memory circuit having a sense amplifier circuit having a sensing amplifier connected to read a data content output of a memory cell, wherein the sense amplifier circuit includes a current source transistor having a gate and having a drain, the drain connected to a voltage supply, and having a source connected to the sense amplifier, the method for providing a selectable sense amplifier source current in order to account for variation from a desired source current due to variations in a designed source current transistor performance parameters, the method comprising:

generating a variable reference voltage with a variable reference voltage generator having an output coupled to the gate of the sense amplifier circuit current source transistor, the generating step including:

varying the variable reference voltage on the output of a supply transistor having an input connected to the voltage supply and an output connected to the output of the variable reference voltage generator and to a current divider network, wherein the varying step comprises:

varying a total flow of current through the current divider network comprising a plurality of variable current flow arms each having a selector for selecting a respective one of the plurality of variable current flow arms to pass current or not pass current, the selector being controlled by a respective bit in a plurality of bits stored in a non-volatile on-chip memory location.

26. The method of claim 25, further comprising:

buffering the output of the variable reference voltage generator thereby providing a buffered output, and connecting the buffered output to the gate of the current source transisor of each of a plurality of sense amplifier circuits, thereby providing a low impedance output for distribution of the output of the variable reference generator to the gate.

27. The method of claim 25, wherein varying the variable reference voltage further comprises:

selectively opening current paths in the current divider network according to contents of a signal, the signal selectable between a first signal and a second signal, the first signal representative of each of a plurality of stored bits stored in the non-volatile on-chip memory location and the second signal representative of a plurality of input bits input to the memory circuit through at least one input/output pin of the memory circuit.

* * * * *